US005667388A

United States Patent [19]
Cottrell

[11] Patent Number: 5,667,388
[45] Date of Patent: Sep. 16, 1997

[54] PRINTED CIRCUIT BOARD ADAPTER CARRIER FOR INPUT/OUTPUT CARDS

[75] Inventor: Stephen E. Cottrell, Pilot Hill, Calif.

[73] Assignee: Intel Corporation, Santa Clara, Calif.

[21] Appl. No.: 339,459

[22] Filed: Nov. 14, 1994

[51] Int. Cl.$^6$ ................................................ H01R 9/09
[52] U.S. Cl. ........................................ 439/74; 439/946
[58] Field of Search ..................... 439/65–74, 76.1, 439/946

[56] References Cited

U.S. PATENT DOCUMENTS

| | | | |
|---|---|---|---|
| 4,454,566 | 6/1984 | Coyne | 361/386 |
| 4,630,170 | 12/1986 | Kask et al. | 361/306 |
| 4,748,537 | 5/1988 | Hernandez et al. | 361/306 |
| 5,000,690 | 3/1991 | Sonobe et al. | 439/354 |
| 5,088,930 | 2/1992 | Murphy | 439/70 |
| 5,099,392 | 3/1992 | Miller et al. | 439/74 |
| 5,151,039 | 9/1992 | Murphy | 439/70 |
| 5,153,818 | 10/1992 | Mukougawa et al. | 439/946 |
| 5,168,432 | 12/1992 | Murphy et al. | 361/421 |
| 5,184,285 | 2/1993 | Murphy et al. | 361/421 |
| 5,311,407 | 5/1994 | Lumbard | 361/813 |
| 5,331,516 | 7/1994 | Shinohara et al. | 439/44 |
| 5,378,160 | 1/1995 | Yumibe et al. | 439/66 |
| 5,391,916 | 2/1995 | Kohno et al. | 361/737 |
| 5,430,614 | 7/1995 | Defrancesco | 439/74 |
| 5,438,481 | 8/1995 | Murphy et al. | 439/70 |

FOREIGN PATENT DOCUMENTS 1206341 9/1970 United Kingdom ............... 317/101 D

OTHER PUBLICATIONS

*PCMCIA Personal Computer Memory Card International Association PC Card Standard Release 2.0*, pp. 3–13 to 3–26 (Sep. 1991).
*PCMCIA Recommended Extensions Release 1.00*, pp. 1–3 to 1–8 (1992).

*Primary Examiner*—Neil Abrams
*Assistant Examiner*—Brian J. Biggi
*Attorney, Agent, or Firm*—Blakely, Sokoloff, Taylor & Zafman

[57] ABSTRACT

A printed circuit board (PCB) adapter carrier provides for the configuration of relatively increased electronics and circuitry for an input/output (I/O) card. The PCB adapter carrier positions an extension printed circuit board (PCB) with a host printed circuit board (PCB) within the package of the I/O card. The PCB adapter carrier includes a lead or leads supported by the PCB adapter carrier to provide for electrical connection between contact areas for the host PCB and the extension PCB, allowing the host PCB and the extension PCB to electrically interact with one another. With an increased amount of PCB real estate to support electronics and circuitry, the functional capabilities for an I/O card may be relatively enhanced. Dummy leads are also provided to increase mechanical rigidity.

36 Claims, 4 Drawing Sheets

PRINTED CIRCUIT BOARD ADAPTER CARRIER FOR INPUT/OUTPUT CARDS

BACKGROUND OF THE INVENTION

1. Field of the Invention

The present invention relates generally to the field of input/output cards for data processing systems. More particularly, the present invention relates to the field of circuitry configurations within input/output cards.

2. Description of the Related Art

Data processing systems have been configured for use with peripheral or input/output (I/O) cards that provide increased functionality for the data processing system. As one example, I/O cards may be used to provide for increased memory capacity for the data processing system. I/O cards may also be used to provide for communications capabilities for the data processing system over a telephone line, for example, with external hosts, data processing systems, or networks for example. I/O cards typically contain a single printed circuit board having electronics and circuitry to implement their functionality.

I/O cards are typically portable cards that may be inserted into and detached from a socket housed within the data processing system. The data processing system and I/O cards may be configured such that different types of I/O cards, such as a modem card or a memory card for example, may be interchangeably inserted in, used, and removed from the same socket. I/O cards provide convenience for users in allowing them to install, as desired, additional capabilities for the data processing system.

The Personal Computer Memory Card International Association (PCMCIA) has devised standards for I/O cards to provide compatibility between various data processing systems and various I/O cards. The PCMCIA standards specify, for example, a 68-pin connector at one end of a PCMCIA card for insertion into a compatible socket in the data processing system. The 68-pin connector provides for a communication interface between the data processing system and the PCMCIA card. To provide communication capabilities for the data processing system, PCMCIA cards may also be configured with another connector for communication over an external network with other data processing systems, for example. This other connector is typically located at the end of the PCMCIA card opposite the 68-pin connector.

The PCMCIA standards also specify the storage of a printed circuit board within a package having specified dimensions for the I/O card. PCMCIA cards may have a Type I, Type II, or Type III packaging format. All three packaging formats specify external dimensions of approximately 85.6 millimeters in length by approximately 54.0 millimeters in width. Type I PCMCIA card is approximately 3.3 millimeters thick. Type II PCMCIA card is approximately 5.0 millimeters thick. Type III PCMCIA card is approximately 10.5 millimeters thick. The functionality provided by PCMCIA cards, however, may be limited as only a limited amount of electronics and circuitry may be configured on a single printed circuit board within the external dimensions specified for each type of PCMCIA card.

SUMMARY AND OBJECTS OF THE INVENTION

One object of the present invention is to provide for the configuration of relatively increased electronics and circuitry for an input/output card.

Another object is to provide for the configuration of an additional printed circuit board for an input/output card.

A printed circuit board (PCB) adapter carrier for connecting a first printed circuit board (PCB) with a second printed circuit board (PCB) within a package for an input/output (I/O) card is described. The first PCB has circuitry and a surface with a first contact area. The second PCB has circuitry and a surface with a second contact area. The PCB adapter carrier includes a support structure having a top for supporting the surface of the second PCB and having a bottom for connection to the surface of the first PCB. The PCB adapter carrier also includes a lead coupled to the support structure for electrical connection between the first contact area of the first PCB and the second contact area of the second PCB.

A printed circuit board (PCB) combination for connection to a first printed circuit board (PCB) within a package for an input/output (I/O) card is also described. The first PCB has circuitry and a surface with a first contact area. The PCB combination includes a second printed circuit board (PCB) having circuitry and a surface with a second contact area. The PCB combination also includes a printed circuit board (PCB) adapter carrier for connecting the first PCB with the second PCB. The PCB adapter carrier includes a support structure having a top supporting the surface of the second PCB and having a bottom for connection to the surface of the first PCB. The PCB adapter carrier also includes a lead, coupled to the support structure and electrically connected to the second contact area of the second PCB, for electrical connection between the first contact area of the first PCB and the second contact area of the second PCB.

An input/output (I/O) card is further described. The I/O card includes a printed circuit board (PCB) assembly. The PCB assembly includes a first printed circuit board (PCB) having circuitry and a surface with a first contact area. The PCB assembly also includes a second printed circuit board (PCB) having circuitry and a surface with a second contact area. The PCB assembly further includes a printed circuit board (PCB) adapter carrier for connecting the first PCB with the second PCB. The PCB adapter carrier includes a support structure having a top supporting the surface of the second PCB and having a bottom connected to the surface of the first PCB. The PCB adapter carrier also includes a lead coupled to the support structure and electrically connected to the first contact area of the first PCB and to the second contact area of the second PCB. The I/O card also includes an I/O card package for packaging the PCB assembly.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for printed circuit board adapter carrier for input/output cards. In the following description, details are set forth such as specific dimensions, input/output applications, configurations, etc., in order to provide a thorough understanding of the present invention. It will be evident, however, that the present invention may be practiced without these details. In other instances, well-known devices, structures, etc., have not been described in particular detail so as not to obscure the present invention.

Figure 1:
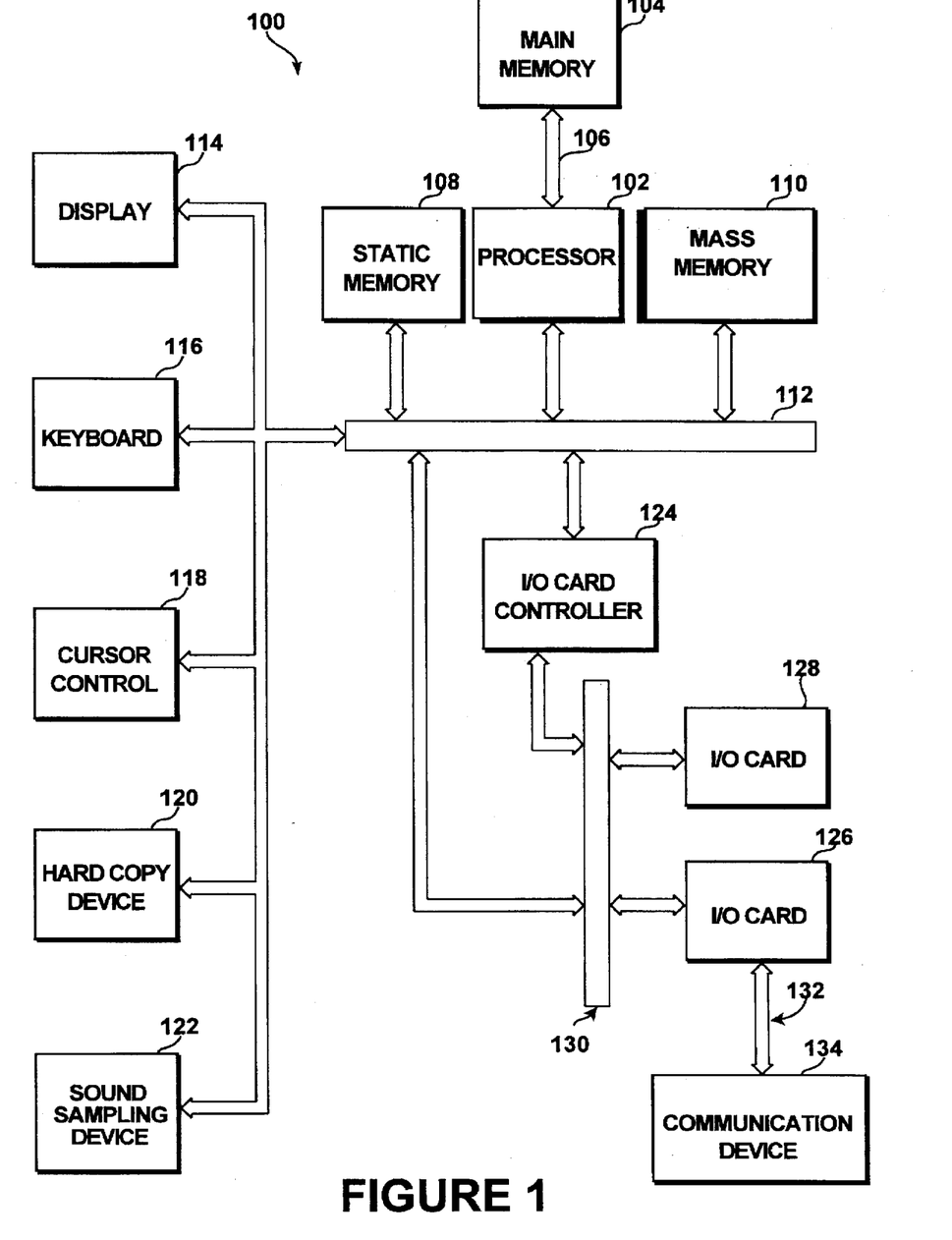
FIG. 1 illustrates, in block diagram form, a data processing system having an input/output card.

FIG. 1 illustrates, in block diagram form, a data processing system 100. Data processing system 100 may be a notebook or laptop computer system. For other embodiments, data processing system 100 may be a desktop or any other suitable type of computer system.

Data processing system 100 includes a processor 102, a main memory 104, a main memory bus 106, a static memory 108, a mass memory 110, a system bus 112, a display 114, an alphanumeric input device 116, a cursor control device 118, a hard copy device 120, a sound sampling device 122, an input/output (I/O) card controller 124, an input/output (I/O) card 126, an I/O card 128, and an input/output (I/O) card bus 130. Main memory bus 106 couples processor 102 and main memory 104. System bus 112 couples processor 102, static memory 108, mass memory 110, display 114, alphanumeric input device 116, cursor control device 118, hard copy device 120, sound sampling device 122, I/O card controller 124, and I/O card bus 130. I/O card bus 130 couples system bus 112, I/O card controller 124, I/O card 126, and I/O card 128.

Processor 102 may include a microprocessor or any other suitable processing device, for example. Processor 102 may execute instructions stored in static memory 108, main memory 104, and/or mass memory 110 for example. Processor 102 may process data stored in static memory 108, main memory 104, and/or mass memory 110 for example. Processor 102 may include a single processing device or a plurality of processing devices.

Static memory 108 may include read only memory (ROM) or any other suitable memory device. Static memory 108 may store, for example, a boot program for execution by processor 102 to initialize data processing system 100. Main memory 104 may include random access memory (RAM) or any other suitable memory device. Mass memory 110 may include a hard disk device, a floppy disk, an optical disk device, a flash memory device, a file server device, or any other suitable memory device. For this detailed description, the term memory includes a single memory device and any combination of suitable memory devices for the storage of data and instructions, for example.

System bus 112 provides for the communication of digital information between hardware devices for data processing system 100. Processor 102 may receive over system bus 112 information that is input by a user through alphanumeric input device 116, cursor control device 118, and/or sound sampling device 122. Alphanumeric input device 116 may include a keyboard, for example, that includes alphanumeric keys. Alphanumeric input device 116 may include other suitable keys, including function keys for example. Alphanumeric input device 116 may be used to input information or commands, for example, for data processing system 100. Cursor control device 118 may include a mouse, touch tablet, track-ball, and/or joystick, for example, for controlling the movement of a cursor displayed by display 114. Sound sampling device 122 may include a microphone, for example, for providing audio recording, information, or commands, for example, for data processing system 100.

Processor 102 may also output over system bus 112 information that is to be displayed on display 114 or outputted by hard copy device 120 or by sound sampling device 122. Display 114 may include a cathode ray tobe (CRT) or a liquid crystal display (LCD), for example, for displaying information to a user. Hard copy device 120 may include a printer or a plotter, for example, for creating hard copies of information for data processing system 100. Sound sampling device 122 may include a speaker, for example, for providing audio information, commands, responses or audio playback, for example, for data processing system 100. Processor 102 may use system bus 112 to transmit information to and to receive information from other hardware devices, including mass memory 110 for example.

Processor 102 may also receive from and output information to I/O card 126 and I/O card 128 using I/O card bus 130. I/O card bus 130 provides for the communication of information between I/O card 126 or I/O card 128 and other devices for data processing system 100. I/O card controller 124 transmits control and address information, for example, over I/O card bus 130 for controlling I/O card 126 and I/O card 128.

I/O card 126 provides for a detachable communication interface for data processing system 100. I/O card 126 may receive information over a communication bus 132 from a communication device 134. I/O card 126 may also transmit information over communication bus 132 to communication device 134. I/O card 126 may serve as a modem card, a facsimile card, a fax/modem card, a local area network (LAN) interface card, a multi-media interface card, or a sound card, for example, for data processing system 100. I/O card 126 may serve to provide for other communication capabilities including wireless communication capabilities, for example, for data processing system 100.

Communication device 134 may include any suitable external communication device, including other data processing systems, memory devices, and file servers for example. Communication bus 132 may include any suitable type of bus configuration. Where I/O card 126 is a fax card or modem card, for example, communication bus 132 may be a telephone line. Where I/O card 126 is a local area network (LAN) interface card, for example, communication bus 132 may be a suitable LAN line. Communication bus 132 may include a wireless interface between I/O card 126 and communication device 134.

I/O card 128 may be configured to provide for increased memory capacity for data processing system 100. I/O card 128 may be a flash memory card, for example. I/O card 128 may also be configured to provide for increased processing capabilities for data processing system 100.

For one embodiment, I/O card 126 and I/O card 128 are PCMCIA cards. I/O card controller 124 and I/O card bus 130 may be configured in accordance with PCMCIA standards for communicating with a PCMCIA card. For other embodiments, I/O card 126 and I/O card 128 may be configured according to other suitable card formats.

Data processing system 100 may include other suitable hardware devices or other suitable combinations of hardware devices. Data processing system 100 may include, for example, one or more other suitable I/O cards coupled to I/O card bus 130. Data processing system 100 may also be configured to couple only one I/O card to I/O card bus 130. I/O card 126 or I/O card 128, for example, may then be interchangeably used with data processing system 100.

Data processing system 100 may be configured without various hardware devices, for example, that are not required for the desired purpose of data processing system 100. Data processing system 100 may be configured without sound sampling device 122 and/or hard copy device 120, for example. Data processing system 100 may also be configured in a variety of manners for any combination of hardware devices. As one example, main memory 104 may be coupled to system bus 112 rather than being coupled to processor 102 by main memory bus 106 as illustrated in FIG. 1.

Figure 2:
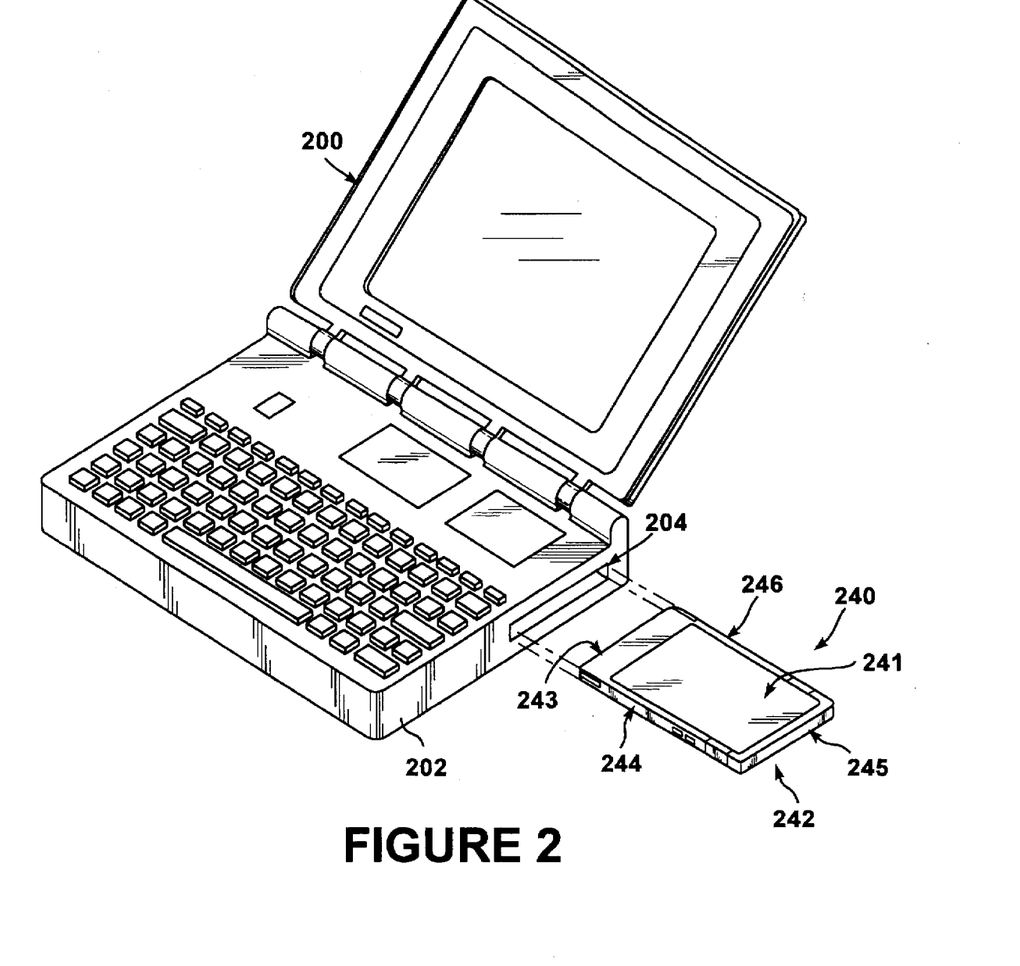
FIG. 2 illustrates a perspective view of a data processing system having a receptacle for receiving an input/output card.

FIG. 2 illustrates a perspective view of a data processing system 200. Data processing system 200 may be configured as data processing system 100 of FIG. 1. The above discussion regarding data processing system 100 likewise applies to data processing system 200. Although illustrated in FIG. 2 as a notebook or laptop computer system, data processing system 200 may be a desktop or any other suitable type of data processing system.

Data processing system 200 includes a housing or body 202 that defines a receptacle 204. Data processing system 200 may receive an I/O card 240 in receptacle 204. Receptacle 204 may have any suitable dimensions that may depend, for example, on the dimensions of I/O card 240. I/O card 240 may be configured as I/O card 126 or I/O card 128 of FIG. 1, for example. The above discussion pertaining to I/O card 126 and I/O card 128 likewise applies to I/O card 240. I/O card 240 has a top surface 241 and a bottom surface 242. I/O card 240 also has an end 243 and an end 245 opposite end 243. I/O card 240 further has a side 244 and a side 246 opposite side 244.

Upon insertion into receptacle 204, I/O card 240 may be connected for communication with data processing system 200 by plugging end 243 of I/O card 240 into a suitable socket internal to body 202 of data processing system 200. I/O card 240 may then communicate with data processing system 200 over an I/O card bus coupled to the socket.

Figure 3:
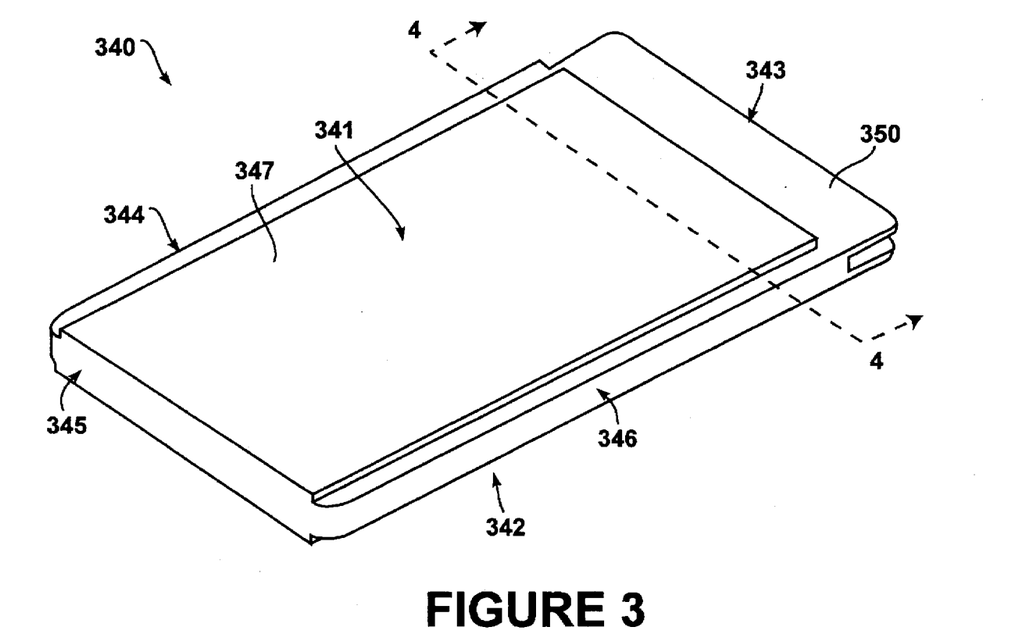
FIG. 3 illustrates a perspective view of a Type II PCMCIA card.
Figure 4:
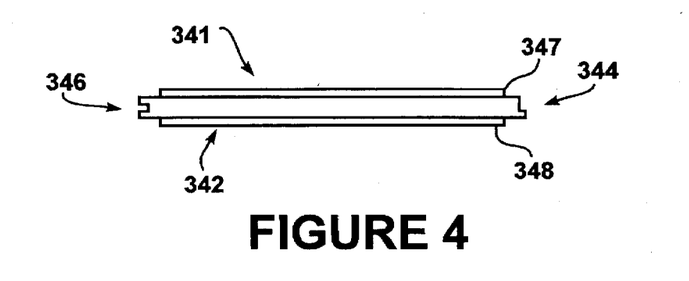
FIG. 4 illustrates a cross-sectional view of a Type II PCMCIA card.

I/O card 240 may be a PCMCIA card, for example. I/O card 240 may be a Type II PCMCIA card as illustrated in FIGS. 3 and 4. FIG. 3 illustrates a perspective view of a Type II PCMCIA card 340. FIG. 4 illustrates a cross-sectional view of Type II PCMCIA card 340 along line 4—4 of FIG. 3.

Type II PCMCIA card 340 has a top surface 341 having a top bubble 347 and a bottom surface 342 having a bottom bubble 348. Type II PCMCIA card 340 also has an end 343 and an end 345 opposite end 343. Type II PCMCIA card 340 further has a side 344 and a side 346 opposite side 344. The length of Type II PCMCIA card 340 from end 343 to end 345 is approximately 85.6 millimeters. The width of Type II PCMCIA card 340 from side 344 to side 346 is approximately 54.0 millimeters.

Top bubble 347 and bottom bubble 348 define a substrate area having a length of approximately 75.6 millimeters, a width of approximately 48.0 millimeters, and a thickness of approximately 5.0 millimeters from top surface 341 to bottom surface 342. Type II PCMCIA card 340 houses electronics and circuitry in the substrate area to implement the functionality for Type II PCMCIA card 340.

Type II PCMCIA card 340 also includes an interconnect area 350 at end 343 and along each side 344 and 346.

Interconnect area 350 has a thickness of approximately 3.30 millimeters from top surface 341 to bottom surface 342. In accordance with PCMCIA standards, Type II PCMCIA card 340 has a 68-pin connector at end 343 for connection to data processing system 200. The connector at end 343 is electrically connected to the electronics and circuitry housed in the substrate area of Type II PCMCIA card 340. Type II PCMCIA card 340 may include another suitable connector or connectors, also electrically connected to the electronics and circuitry housed in the substrate area, along side 344 and/or side 346 for connection to data processing system 200.

For communication cards, Type II PCMCIA card 340 may also be configured with a suitable connector, including a 14-pin connector for example, at end 345 to provide communication capabilities for data processing system 200. The connector at end 345 may be electrically connected to the electronics and circuitry housed in the substrate area of Type II PCMCIA card 340.

Figure 5:
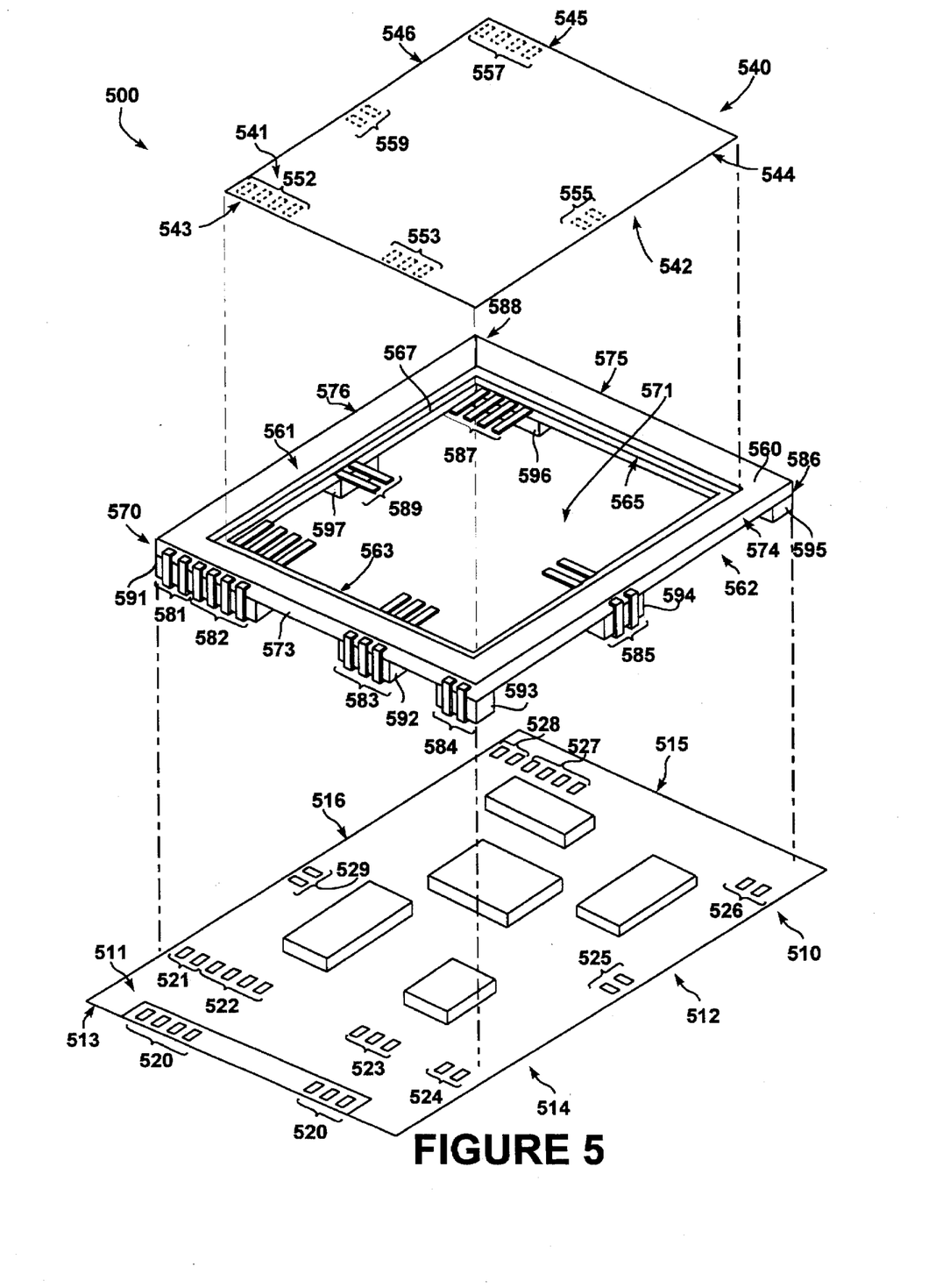
FIG. 5 illustrates a perspective view of a printed circuit board adapter carrier for connecting printed circuit boards within an input/output card.

FIG. 5 illustrates, for one embodiment, a printed circuit board (PCB) assembly 500 including a printed circuit board (PCB) adapter carrier 570 for connecting an extension printed circuit board (PCB) 540 to a host printed circuit board (PCB) 510 within I/O card 240. PCB assembly 500 may be packaged within Type II PCMCIA card 340, for example. PCB assembly 500 may also be packaged within an I/O card 240 having other suitable packaging formats.

Host PCB 510 has a top surface 511 and a bottom surface 512. Host PCB 510 also has an end 513 and an end 515 opposite end 513. Host PCB 510 further has a side 514 and a side 516 opposite side 514. Host PCB 510 is illustrated as being rectangular in shape but may have other suitable shapes. Host PCB 510 may have any suitable dimensions that may depend, for example, on the dimensions for I/O card 240.

Host PCB 510 includes electronics and circuitry for implementing the functionality for I/O card 240. Host PCB 510 may include on top surface 511 and/or bottom surface 512 any suitable combination of various integrated circuit chips, resistors, capacitors, inductors, and/or wiring, for example, that may depend on the functionality I/O card 240 is designed to implement. Host PCB 510 may include electronics and circuitry, for example, to provide data modem capabilities for I/O card 240.

Extension PCB 540 has a top surface 541 and a bottom surface 542. Extension PCB 540 also has sides 543, 544, 545, and 546. Side 543 is opposite side 545 while side 544 is opposite side 546. Extension PCB 540 is illustrated as being rectangular in shape but may have other suitable shapes. Extension PCB 540 may have any suitable dimensions that may depend, for example, on the dimensions for PCB adapter carrier 570.

Extension PCB 540 also includes electronics and circuitry for implementing the functionality for I/O card 240. Extension PCB 540 may include on top surface 541 and/or bottom surface 542 any suitable combination of various integrated circuit chips, resistors, capacitors, inductors, and/or wiring, for example, that may depend on the functionality I/O card 240 is designed to implement. Extension PCB 540 may include electronics and circuitry, for example, to provide voice modem capabilities for I/O card 240.

Host PCB 510 and extension PCB 540 may be electrically connected using PCB adapter carrier 570 to allow the circuitry for host PCB 510 and the circuitry for extension PCB 540 to electrically interact in implementing the functionality for I/O card 240. The electronics and circuitry to implement the functionality for I/O card 240 may thus be positioned and configured in any suitable manner using the PCB real estate provided by both host PCB 510 and extension PCB 540 as desired.

To provide for electrical and/or mechanical connection to PCB adapter carrier 570, host PCB 510 includes sets of contact areas 521, 522, 523, 524, 525, 526, 527, 528, and 529 on top surface 511. Contact area sets 521, 522, 523, and 524 include two, four, three, and two contact areas, respectively, and are positioned near end 513. Contact area set 525 includes two contact areas and is positioned near side 514. Contact area sets 526, 527, and 528 include two, four, and two contact areas, respectively, and are positioned near end 515. Contact area set 529 includes two contact areas and is positioned near side 516. Host PCB 510 may include any suitable number of contact areas or contact area sets that may be positioned in any suitable location to provide for electrical and/or mechanical connection to PCB adapter carrier 570. The contact areas may include any suitable type of connectors, including bonding pads for example, for connection to PCB adapter carrier 570.

Extension PCB 540 also includes sets of contact areas 552, 553, 555, 557, and 559 on bottom surface 542 for electrical and/or mechanical connection to PCB adapter carrier 570. Contact area sets 552 and 553 include four and three contact areas, respectively, and are positioned near side 543. Contact area set 555 includes two contact areas and is positioned near side 544. Contact area set 557 includes four contact areas and is positioned near side 545. Contact area set 559 includes two contact areas and is positioned near side 546. Extension PCB 540 may include any suitable number of contact areas or contact area sets that may be positioned in any suitable location to provide for electrical and/or mechanical connection to PCB adapter carrier 570. The contact areas may include any suitable type of connectors, including bonding pads for example, for connection to PCB adapter carrier 570.

PCB adapter carrier 570 includes a frame 560 that defines an opening 571. Frame 560 has a top 561 and a bottom 562. Frame 560 also has an exterior perimeter having outer sides 573, 574, 575, and 576. Outer side 573 is opposite outer side 575 while outer side 574 is opposite outer side 576. Frame 560 further has an interior perimeter having inner sides 563, 564, 565, and 566. Inner side 563 is opposite inner side 565 while inner side 564 is opposite inner side 566. Frame 560 may also define an optional interior ledge 567 along the interior perimeter for supporting and positioning extension PCB 540 within PCB adapter carrier 570. The exterior and interior perimeters of frame 560 are illustrated as being rectangular in shape but may have other shapes. Frame 560 may be made using any suitable material, including a plastic or other suitable non-conductive material for example.

Frame 560 may have any suitable dimensions that may depend, for example, on the dimensions for I/O card 240. For one embodiment, PCB adapter carrier 570 may be configured to fit within the substrate area of Type II PCM-CIA card 340, for example. Frame 560 may have a length of approximately 71.6 millimeters from outer side 573 to outer side 575, a width of approximately 44.0 millimeters from outer side 574 to outer side 576, and a thickness of approximately 0.9 millimeters from top 561 to bottom 562, for example. Frame 560 may have other suitable dimensions.

PCB adapter carrier 570 also includes sets of leads 581, 582, 583, 584, 585, 586, 587, 588, and 589 supported by frame 560 to provide for electrical and/or mechanical connection to host PCB 510 and/or to extension PCB 540. Each lead for lead sets 581–589 may be made from any suitable material, including copper, brass, or any other suitable conductive material for example.

Lead set 581 includes two leads positioned along outer side 573 near outer side 576. Each lead for lead set 581 extends outward from outer side 573 of frame 560 and downward along an extended portion 591 of outer side 573 toward bottom 562 of frame 560. At bottom 562, each lead for lead set 581 extends inward toward opposite side 575 over at least a portion of the underside of extended portion 591.

Lead set 582 includes four leads positioned along outer side 573. Each lead for lead set 582 extends inward toward opposite side 575 and into opening 571 from inner side 563 of frame 560. Each lead for lead set 582 runs from inner side 563 through frame 560 and extends outward from outer side 573 of frame 560 and downward along extended portion 591 of outer side 573 toward bottom 562 of frame 560. At bottom 562, each lead for lead set 582 extends inward toward opposite side 575 over at least a portion of the underside of extended portion 591.

Lead set 583 includes three leads positioned along outer side 573. Each lead for lead set 583 extends inward toward opposite side 575 and into opening 571 from inner side 563 of frame 560. Each lead for lead set 583 runs from inner side 563 through frame 560 and extends outward from outer side 573 of frame 560 and downward along an extended portion 592 of outer side 573 toward bottom 562 of frame 560. At bottom 562, each lead for lead set 583 extends inward toward opposite side 575 over at least a portion of the underside of extended portion 592.

Lead set 584 includes two leads positioned along outer side 573 near outer side 574. Each lead for lead set 584 extends outward from outer side 573 of frame 560 and downward along an extended portion 593 of outer side 573 toward bottom 562 of frame 560. At bottom 562, each lead for lead set 584 extends inward toward opposite side 575 over at least a portion of the underside of extended portion 593.

Lead set 585 includes two leads positioned along outer side 574. Each lead for lead set 585 extends inward toward opposite side 576 and into opening 571 from inner side 564 of frame 560. Each lead for lead set 585 runs from inner side 564 through frame 560 and extends outward from outer side 574 of frame 560 and downward along an extended portion 594 of outer side 574 toward bottom 562 of frame 560. At bottom 562, each lead for lead set 585 extends inward toward opposite side 576 over at least a portion of the underside of extended portion 594.

Lead set 586 includes two leads positioned along outer side 575 near outer side 574. Each lead for lead set 586 extends outward from outer side 575 of frame 560 and downward along an extended portion 595 of outer side 575 toward bottom 562 of frame 560. At bottom 562, each lead for lead set 586 extends inward toward opposite side 573 over at least a portion of the underside of extended portion 595.

Lead set 587 includes four leads positioned along outer side 575. Each lead for lead set 587 extends inward toward opposite side 573 and into opening 571 from inner side 565 of frame 560. Each lead for lead set 587 runs from inner side 565 through frame 560 and extends outward from outer side 575 of frame 560 and downward along an extended portion 596 of outer side 575 toward bottom 562 of frame 560. At bottom 562, each lead for lead set 587 extends inward toward opposite side 573 over at least a portion of the underside of extended portion 596.

Lead set 588 includes two leads positioned along outer side 575 near outer side 576. Each lead for lead set 588 extends outward from outer side 575 of frame 560 and downward along extended portion 596 of outer side 575 toward bottom 562 of frame 560. At bottom 562, each lead for lead set 588 extends inward toward opposite side 573 over at least a portion of the underside of extended portion 596.

Lead set 589 includes two leads positioned along outer side 576. Each lead for lead set 589 extends inward toward opposite side 574 and into opening 571 from inner side 566 of frame 560. Each lead for lead set 589 runs from inner side 566 through frame 560 and extends outward from outer side 576 of frame 560 and downward along an extended portion 597 of outer side 576 toward bottom 562 of frame 560. At bottom 562, each lead for lead set 589 extends inward toward opposite side 574 over at least a portion of the underside of extended portion 597.

The leads of lead sets 581–589 may be supported by frame 560 in other suitable manners. For example, each lead for lead sets 582, 583, 585, 587, and 589 may extend from opening 571, over top 561 of frame 560, and downward along the exterior perimeter of frame 560. Each lead for lead sets 582, 583, 585, 587, and 589 may be suitably attached to top 561 for support by frame 560. As another example, each lead for lead sets 582, 583, 585, 587, and 589 may also extend from opening 571 and downward along the interior perimeter of frame 560. Each lead for lead sets 582, 583, 585, 587, and 589 may be suitably attached to the interior perimeter for support by frame 560. As a further example, each lead for lead sets 582, 583, 585, 587, and 589 may also extend from opening 571 and downward through frame 560 to bottom 562.

Although illustrated as providing for a direct vertical connection along the exterior perimeter of frame 560, each lead for lead sets 582, 583, 585, 587, and 589 may also be routed in various directions about the interior perimeter of frame 560, the exterior perimeter of frame 560, and/or through frame 560 in providing for electrical and/or mechanical connection for host PCB 510 and extension PCB 540.

PCB adapter carrier 570 may include any suitable number of leads or lead sets that may be positioned along frame 560 in any suitable location. The number and location of leads supported by frame 560 may depend, for example, on the number and location of contact areas for host PCB 510 and for extension PCB 540 to be connected to PCB adapter carrier 570.

PCB adapter carrier 570 may also include other suitable frames or support structures for supporting a lead or leads for connecting extension PCB 540 with host PCB 510. PCB adapter carrier 570 may include a frame similar to frame 560 without extension portions 591–597 but rather configured with a substantially uniform thickness around the exterior and the interior perimeter, for example. PCB adapter carrier 570 may also include a frame similar to frame 560 with one or more portions of sides 573–576 removed, for example. PCB adapter carrier 570 may further include a frame similar to frame 560 having less than four sides 573–576 defining opening 571, for example. Such a frame may include only sides 573, 575, and 576, for example, defining opening 571. Such a frame may also include only sides 573 and 576, for example, defining opening 571. The configuration for the frame or support structure for PCB adapter carrier 570 may also depend, for example, on any automation capability in connecting PCB adapter carrier 570 to host PCB 510 and/or extension PCB 540.

Extension PCB 540 may be connected at the top of PCB adapter carrier 570 by connecting the contact areas of sets 552, 553, 555, 557, and 559 of extension PCB 540 to that portion of the leads extending into opening 571 for lead sets 582, 583, 585, 587, and 589, respectively. Contact area sets 552, 553, 555, 557, and 559 may be connected to lead sets 582, 583, 585, 587, and 589, respectively, using any suitable technique, including solder reflow techniques or hot bar solder techniques for example.

In connecting extension PCB 540 to PCB adapter carrier 570, extension PCB 540 may be placed over the top of PCB adapter carrier 570 and fitted to rest on interior ledge 567 of frame 560 and/or on that portion of the leads for lead sets 582, 583, 585, 587, and 589 extending into opening 571. Alternatively, extension PCB 540 may placed over the top of PCB adapter carrier 570 and fitted within the interior perimeter to rest on that portion of the leads for lead sets 582, 583, 585, 587, and 589 extending into opening 571. In placing extension PCB 540 over PCB adapter carrier 570, any electronics and circuitry on bottom surface 542 of extension PCB 540 may extend downward into opening 571 of PCB adapter carrier 570.

Extension PCB 540 and PCB adapter carrier 570 may be configured for connection in other suitable manners. As one example, extension PCB 540 may be configured with contact area sets 552, 553, 555, 557, and 559 on top surface 541 of extension PCB 540 and positioned beneath that portion of the leads of lead sets 582, 583, 585, 587, and 589 extending into opening 571 to connect extension PCB 540 to PCB adapter carrier 570. As another example, the leads for lead sets 582, 583, 585, 587, and 589 may extend along the exterior perimeter of frame 560 and inward over at least a portion of top 561 of frame 560. Extension PCB 540 may be configured for placement over top 561 of frame 560 such that contact area sets 552, 553, 555, 557, and 559 may be connected to lead sets 582, 583, 585, 587, and 589, respectively, at top 561. Extension PCB 540 and PCB adapter carrier 570 may be turned upside-down to provide for this connection.

Once connected to PCB adapter carrier 570, extension PCB 540 may be suitably tested, for example, using lead sets 582, 583, 585, 587, and 589 from the bottom of PCB adapter carrier 570.

PCB adapter carrier 570 may be suitably connected to top surface 511 of host PCB 510 by connecting that portion of the leads of lead sets 581–589 at bottom 562 to the contact areas of sets 521–529, respectively. Contact area sets 521–529 may be connected to lead sets 581–589, respectively, using any suitable technique, including solder reflow techniques, hot bar solder techniques, or other suitable surface mount techniques for example. As PCB adapter carrier 570 may have a relatively small thickness, any electronics and circuitry extending from bottom surface 542 of extension PCB 540 into opening 571 are preferably configured to fit within cavities, such as spacings between integrated circuit chips for example, among any electronics and circuitry extending from top surface 511 of host PCB 510 into opening 571.

The circuitry for host PCB 510 and for extension PCB 540 may thus be electrically connected to one another as leads for lead sets 582, 583, 585, 587, and 589 are connected to both contact areas of sets 522, 523, 525, 527, and 529 of host PCB 510, respectively, and contact areas of sets 552, 553, 555, 557, and 559 of extension PCB 540, respectively. For other embodiments, the circuitry for host PCB 510 and for extension PCB 540 may be electrically connected to one another in other suitable manners. As one example, flex circuits may be used in lieu of or together with leads of PCB adapter carrier 570 for providing such electrical connections.

The leads for lead sets 581, 584, 586, and 588 are dummy leads and do not provide for any electrical connection between host PCB 510 and extension PCB 540. The contact areas of sets 521, 524, 526, and 528 are dummy contact areas and do not provide for any electrical connection to the circuitry for host PCB 510. Dummy contact area sets 521, 524, 526, and 528 are connected to dummy lead sets 581, 584, 586, and 588 to provide for mechanical rigidity and strength for PCB assembly 500. Other suitable leads, similar to the leads of lead set 582 for example, may also be used as dummy leads for connection to other dummy contact areas on host PCB 510 and/or extension PCB 540. For other embodiments, alternative connection techniques may be used in lieu of or together with dummy leads to provide for a relatively rigid mechanical attachment of host PCB 510 and extension PCB 540 to PCB adapter carrier 570.

Once connected together, PCB assembly 500 may be suitably tested using any suitable contact areas provided for external electrical connection to the combined circuitry for host PCB 510 and extension PCB 540.

As illustrated in FIG. 5, host PCB 510 includes contact areas 520 on top surface 511 at end 513 to provide for electrical connection between data processing system 200 and the combined circuitry for host PCB 510 and extension PCB 540. Where I/O card 240 is a PCMCIA card, for example, contact areas 520 may be electrically connected to a 68-pin connector at end 243 of I/O card 240. Contact areas 520 may also be positioned at other suitable locations on host PCB 510. Contact areas 520 may include any suitable electrical connectors, such as bonding pads for example.

Host PCB 510 may also include a contact area or areas positioned at any suitable location to provide for electrical connection between data processing system 200 and the combined circuitry of host PCB 510 and extension PCB 540 using a suitable connector along side 244 and/or side 246 of I/O card 240. Such a contact area or areas may be positioned on top surface 511 near side 514 and/or side 516, for example, and may include any suitable electrical connectors, such as bonding pads for example. Host PCB 510 may further include a contact area or areas positioned at any suitable location to provide for electrical connection between a communication device external to data processing system 200 and the combined circuitry for host PCB 510 and extension PCB 540 using a suitable connector at end 245 of I/O card 240. Such a contact area or areas may be positioned on top surface 511 near end 515, for example, and may include any suitable electrical connectors, such as bonding pads for example.

PCB assembly 500 of FIG. 5 may be suitably packaged within an I/O card 240 having any suitable packaging format. For one embodiment, PCB assembly 500 may be packaged within Type II PCMCIA card 340 of FIGS. 3 and 4, for example, by configuring PCB adapter carrier 570 to fit within the substrate area of Type II PCMCIA card 340. PCB adapter carrier 570 may be sized and configured to extend within the external dimensions of top bubble 347 when packaging PCB assembly 500 in Type II PCMCIA card 340. PCB assembly 500 may also be configured such that PCB adapter carrier 570 along with extension PCB 540 attach to bottom surface 512 of host PCB 510. PCB adapter carrier 570 may then be sized and configured to extend within the external dimensions of bottom bubble 348 when packaging PCB assembly 500 in Type II PCMCIA card 340.

PCB adapter carrier 570 serves to provide for an electrical and mechanical connection between host PCB 510 and extension PCB 540. PCB adapter carrier 570 also serves to position extension PCB 540 with host PCB 510 within the package for I/O card 240. As compared to prior I/O cards that house only a single printed circuit board to implement the functionality for the I/O card, PCB adapter carrier 570 provides for a relatively increased amount of PCB real estate for supporting electronics and circuitry, such as tracing wires and integrated circuit chips for example, for I/O card 240. The functional capabilities for I/O card 240 may thus be relatively enhanced.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

The invention claimed is:

1. A printed circuit board (PCB) adapter carrier for connecting a first printed circuit board (PCB) with a second printed circuit board (PCB) within a package for a PCMCIA compatible input/output (I/O) card, said card being insertable into a socket within a data processing system, the first PCB having circuitry and a surface with a first contact area, the second PCB having circuitry and a surface with a second contact area, the PCB adapter carrier comprising:

a support structure having a top for supporting the surface of the second PCB and having a bottom for connection to the surface of the first PCB; and a lead coupled to the support structure for electrical connection between the first contact area of the first PCB and the second contact area of the second PCB.

2. The PCB adapter carrier of claim 1, wherein the first contact area is a bonding pad and the second contact area is a bonding pad.

3. The PCB adapter carrier of claim 1, comprising a dummy lead coupled to the support structure for connection to a dummy contact area of the first PCB.

4. The PCB adapter carrier of claim 1, wherein the support structure includes a frame having a top for supporting the surface of the second PCB and having a bottom for connection to the surface of the first PCB, the frame having at least three sides and having an interior perimeter that defines an opening.

5. The PCB adapter carrier of claim 4, wherein the interior perimeter of the frame defines a ledge for supporting the second PCB within the frame.

6. The PCB adapter carrier of claim 4, wherein the lead extends into the opening of the frame for electrical connection to the second contact area of the second PCB and extends to the bottom of the frame for electrical connection to the first contact area of the first PCB.

7. A printed circuit board (PCB) combination for connection to a first printed circuit board (PCB) within a package for a PCMCIA compatible input/output (I/O) card, said card being insertable into a socket within a data processing system, the first PCB having circuitry and a surface with a first contact area, the PCB combination comprising:

(a) a second printed circuit board (PCB) having circuitry and a surface with a second contact area; and (b) a printed circuit board (PCB) adapter carrier for connecting the first PCB with the second PCB, the PCB adapter carrier comprising:

(i) a support structure having a top supporting the surface of the second PCB and having a bottom for connection to the surface of the first PCB, and (ii) a lead, coupled to the support structure and electrically connected to the second contact area of the second PCB, for electrical connection between the first contact area of the first PCB and the second contact area of the second PCB.

8. The PCB combination of claim 7, wherein the first contact area is a bonding pad and the second contact area is a bonding pad.

9. The PCB combination of claim 7, comprising a dummy lead coupled to the support structure for connection to a dummy contact area of the first PCB.

10. The PCB combination of claim 7, wherein the support structure includes a frame having a top supporting the surface of the second PCB and having a bottom for connection to the surface of the first PCB, the frame having at least three sides and having an interior perimeter that defines an opening.

11. The PCB combination of claim 10, wherein the interior perimeter of the frame defines a ledge for supporting the second PCB within the frame.

12. The PCB combination of claim 10, wherein the lead extends into the opening of the frame for electrical connection to the second contact area of the second PCB and extends to the bottom of the frame for electrical connection to the first contact area of the first PCB.

13. A PCMCIA input/output (I/O) card, said card being insertable into a socket within a data processing system, said card comprising:

(a) a printed circuit board (PCB) assembly comprising:
   (i) a first printed circuit board (PCB) having circuitry and a surface with a first contact area,
   (ii) a second printed circuit board (PCB) having circuitry and a surface with a second contact area, and
   (iii) a printed circuit board (PCB) adapter carrier comprising:
      (A) a support structure having a top supporting the surface of the second PCB and having a bottom connected to the surface of the first PCB, and
      (B) a lead coupled to the support structure and electrically connected to the first contact area of the first PCB and to the second contact area of the second PCB; and a PCMCIA compatible input/output (I/O) card package for packaging the PCB assembly.

14. The PCMCIA compatible I/O card of claim 13, wherein the first contact area is a bonding pad and the second contact area is a bonding pad.

15. The PCMCIA compatible I/O card of claim 13, comprising a dummy lead coupled to the support structure for connection to a dummy contact area of the first PCB.

16. The PCMCIA compatible I/O card of claim 13, wherein the support structure includes a frame having a top supporting the surface of the second PCB and having a bottom connected to the surface of the first PCB, the frame having at least three sides and having an interior perimeter that defines an opening.

17. The PCMCIA compatible I/O card of claim 16, wherein the interior perimeter of the frame defines a ledge for supporting the second PCB within the frame.

18. The PCMCIA compatible I/O card of claim 16, wherein the lead extends into the opening of the frame for electrical connection to the second contact area of the second PCB and extends to the bottom of the frame for electrical connection to the first contact area of the first PCB.

19. A printed circuit board (PCB) adapter carrier for connecting a first printed circuit board (PCB) with a second printed circuit board (PCB) within a package for a PCMCIA compatible input/output (I/O) card, said card being insertable into a socket within a data processing system, the first PCB having circuitry and a surface with a second contact area, the PCB adapter carrier comprising:

support means for supporting the surface of the second PCB and for connection to the surface of the first PCB; and connector means coupled to the support means for providing electrical connection between the first contact area of the first PCB and the second contact area of the second PCB.

20. The PCB adapter carrier of claim 19, wherein the first contact area is a bonding pad and the second contact area is a bonding pad.

21. The PCB adapter carrier of claim 19, comprising means coupled to the support means for providing mechanical connection to the surface of the first PCB.

22. The PCB adapter carrier of claim 19, wherein the support means includes a frame having a top for supporting the surface of the second PCB and having a bottom for connection to the surface of the first PCB, the frame having at least three sides and having an interior perimeter that defines an opening.

23. The PCB adapter carrier of claim 22, wherein the interior perimeter of the frame defines a ledge for supporting the second PCB within the frame.

24. The PCB adapter carrier of claim 22, wherein the connector means includes a lead extending into the opening of the frame for electrical connection to the second contact area of the second PCB and extending to the bottom of the frame for electrical connection to the first contact area of the first PCB.

25. A printed circuit board (PCB) combination for connection to a first printed circuit board (PCB) within a package for a PCMCIA compatible input/output (I/O) card, said card being insertable into a socket within a data processing system, the first PCB having circuitry and a surface with a first contact area, the PCB combination comprising:

(a) a second printed circuit board (PCB) having circuitry and a surface with a second contact area; and (b) printed circuit board (PCB) adapter carrier means for connecting the first PCB with the second PCB, the PCB adapter carrier means comprising:
   (i) support means for supporting the surface of the second PCB and for connection to the surface of the first PCB, and
   (ii) connector means, coupled to the support means, for providing electrical connection between the first contact area of the first PCB and the second contact area of the second PCB.

26. The PCB combination of claim 25, wherein the first contact area is a bonding pad and the second contact area is a bonding pad.

27. The PCB combination of claim 25, comprising means coupled to the support means for providing mechanical connection to the surface of the first PCB.

28. The PCB combination of claim 25, wherein the support means includes a frame having a top supporting the surface of the second PCB and having a bottom for connection to the surface of the first PCB, the frame having at least three sides and having an interior perimeter that defines an opening.

29. The PCB combination of claim 28, wherein the interior perimeter of the frame defines a ledge for supporting the second PCB within the frame.

30. The PCB combination of claim 28, wherein the connector means includes a lead extending into the opening of the frame for electrical connection to the second contact area of the second PCB and extending to the bottom of the frame for electrical connection to the first contact area of the first PCB.

31. A PCMCIA compatible input/output (I/O) card, said card comprising:
 (a) a printed circuit board (PCB) assembly comprising:
  (i) a first printed circuit board (PCB) having circuitry and a surface with a first contact area,
  (ii) a second printed circuit board (PCB) having circuitry and a surface with a second contact area, and
  (iii) a printed circuit board (PCB) adapter carrier means for connecting the first PCB with the second PCB, the PCB adapter carrier means comprising:
   (A) support means for supporting the surface of the second PCB and for connection to the surface of the first PCB, and
   (B) connector means, coupled to the support means for providing electrical connection between the first contact area of the first PCB and the second contact area of the second PCB; and
 (b) A PCMCIA compatible input/output (I/O) card package means for packaging the PCB assembly.

32. The PCMCIA compatible I/O card of claim 31, wherein the first contact area is a bonding pad and the second contact area is a bonding pad.

33. The PCMCIA compatible I/O card of claim 31, further comprising means coupled to the support means for providing mechanical connection to the surface of the first PCB.

34. The PCMCIA compatible I/O card of claim 31, wherein the support means includes a frame having a top supporting the surface of the second PCB and having a bottom connected to the surface of the first PCB, the frame having at least three sides and having an interior perimeter that defines an opening.

35. The PCMCIA compatible I/O card of claim 34, wherein the interior perimeter of the frame defines a ledge for supporting the second PCB within the frame.

36. The PCMCIA compatible I/O card of claim 34, wherein the connector means includes a lead extending into the opening of the frame for electrical connection to the second contact area of the second PCB and extending to the bottom of the frame for electrical connection to the first contact area of the first PCB.

\* \* \* \* \*

UNITED STATES PATENT AND TRADEMARK OFFICE
CERTIFICATE OF CORRECTION

PATENT NO. : 5,667,388
DATED      : September 16, 1997
INVENTOR(S) : Stephen E. Cottrell It is certified that error appears in the above-indentified patent and that said Letters Patent is hereby corrected as shown below:

In column 13 at line 57 delete "flame" and insert --frame--

In column 14 at line 1 delete "primed" and insert --printed--

Signed and Sealed this

Seventh Day of July, 1998

Attest:

BRUCE LEHMAN

Attesting Officer

Commissioner of Patents and Trademarks